United States Patent
Lee et al.

(10) Patent No.: US 7,889,034 B2
(45) Date of Patent: Feb. 15, 2011

(54) METHOD OF HIGH MAGNETIC FIELD SUPERCONDUCTING MAGNET

(75) Inventors: Byoung-Seob Lee, Daejeon (KR); Dong-Lak Kim, Daejeon (KR); Hyun-Sik Kim, Daejeon (KR); Jong-Shin Yoo, Daejeon (KR)

(73) Assignee: Korea Basic Science Institute, Daejeon (KR)

( * ) Notice: Subject to any disclaimer, the term of this patent is extended or adjusted under 35 U.S.C. 154(b) by 189 days.

(21) Appl. No.: 11/568,024

(22) PCT Filed: Nov. 29, 2005

(86) PCT No.: PCT/KR2005/004030

§ 371 (c)(1),
(2), (4) Date: Aug. 31, 2009

(87) PCT Pub. No.: WO2006/065027

PCT Pub. Date: Jun. 22, 2006

(65) Prior Publication Data

US 2009/0322457 A1   Dec. 31, 2009

(30) Foreign Application Priority Data

Dec. 14, 2004   (KR) .................... 10-2004-0105606

(51) Int. Cl.
*H01F 6/00* (2006.01)
*G01V 3/00* (2006.01)
(52) U.S. Cl. .................. 335/216; 324/319; 324/320
(58) Field of Classification Search ......... 324/318–320; 335/216
See application file for complete search history.

(56) References Cited

U.S. PATENT DOCUMENTS

| 5,006,804 | A | * | 4/1991 | Dorri et al. ................ 324/320 |
| 5,084,677 | A | * | 1/1992 | McDougall ............... 324/320 |
| 5,266,913 | A | * | 11/1993 | Chapman ................... 335/216 |
| 5,323,135 | A | * | 6/1994 | Schmidt et al. ............ 335/299 |
| 6,265,960 | B1 | * | 7/2001 | Schauwecker et al. ..... 335/301 |
| 6,496,091 | B2 | * | 12/2002 | Schauwecker et al. ..... 335/216 |
| 6,664,879 | B2 | * | 12/2003 | Forbes et al. .............. 335/301 |
| 6,680,662 | B2 | * | 1/2004 | Schauwecker et al. ..... 335/216 |
| 2002/0105402 | A1 | | 8/2002 | Crozier et al. |

FOREIGN PATENT DOCUMENTS

| JP | 06176917 A | 6/1994 |
| KR | 1020030012548 A | 2/2003 |
| KR | 1020030093589 A | 12/2003 |

\* cited by examiner

*Primary Examiner*—Ramon M Barrera
(74) *Attorney, Agent, or Firm*—Alston & Bird LLP

(57) ABSTRACT

Disclosed is a method for designing a superconducting magnet for generating high magnetic fields with high uniformity for controlling a stray field to be within an allowable range and acquiring structural and magnetic stability by optimizing the arrangement of positions and shapes of coils configuring the superconducting magnet. Volumes of a main coil and a shielding coil are set to be variables, and the critical value of a wires related on the current and magnetic field, the heat transfer depth, and the quench strain are defined to be restriction conditions so that linear programming is applied to determine an initial shape of the shielding coil and division of the main coil based on the sum of total volumes, that is, an objective function. The initial shapes of the main coil and the shielding coil determined through the linear programming are revised and the shape of a shimming coil is determined by using non-linear programming based on the objective function.

13 Claims, 3 Drawing Sheets

METHOD OF HIGH MAGNETIC FIELD SUPERCONDUCTING MAGNET

BACKGROUND OF THE INVENTION (a) Field of the Invention

The present invention relates to a method of designing a high magnetic field superconducting magnet. More specifically, the present invention relates to the design method of superconducting magnets for generating a high magnetic field with high uniformity for acquiring structural and magnetic stability by respectively arranging positions and forms of coils configuring a superconducting magnet in an optimized method.

(b) Description of the Related Art

A solenoid superconducting magnet is applied to systems that require high uniformity and high magnetic fields in a predetermined space such as a Fourier transform ion cyclotron resonance mass spectrometer (FT-ICR MS), a nuclear magnetic resonance (NMR) instrument, and a magnetic resonance imaging (MRI) instrument. Conventional permanent superconducting magnets for generating high magnetic fields are designed by using the multi-section solenoid scheme with magnetic compensation in which a plurality of solenoids are arranged in the axial direction and spatial positions and geometric forms of coils are optimized so as to offset up to 8- or 12-degree Legendre function terms on required magnetic fields. In this instance, in order to arrange the solenoid coils in an optimized method, a volume including superconducting wires is defined to be a reference so as to reduce the cost of superconducting wires to be used by setting the spatial positions and the geometric shapes of the respective coils as design factors, a first optimization is performed with design information given from the instrument and the superconducting wire as restriction conditions, and a second optimization is performed with an allowable stress as an optimization condition for the purpose of structural stability of the designed coils, thereby acquiring the structural stability.

It is important for the first optimization to establish factors on the initial coil division since the first optimization initially determines division of coils and then optimizes the division, and it frequently fails to provide solutions since multi-variable optimizations cannot satisfy various given conditions. It is easy for the superconducting magnet below 7 Tesla that uses a single main coil without dividing the main coil to establish initial values since restriction conditions and calculation on the initial values are simple. However, the design of a superconducting magnet for acquiring high magnetic fields of more than the 9 Tesla requires division of the main coil, and the establishment of appropriate standards for dividing the coil completely depends on trial and error and designer experience. Therefore, it is needed to develop appropriate standards in order to reduce time loss and acquire system reliability.

The second optimization performs optimization that uses the multi-variable nonlinear optimization scheme by establishing design information provided by the device and the superconducting wire on the reference forms of the volume cost of coils, and establishing the allowable stress to be an additional restriction condition for the purpose of the structural stability of coils. In this instance, since plural partial minimum values can be given due to the characteristics of the multi-variable nonlinear optimization function, selection of a desired solution depends on the designer's experience, and it takes time and effort to check and estimate various results and determine an appropriate optimal solution. Also, the coil is multi-divided as the intensity of the magnetic field to be acquired from the superconducting magnet has a higher field, and hence variables used in the function are added and therefore the restriction conditions are to be additionally established, but additional restriction conditions cannot be established since the currently used restriction conditions are not for the respective divided coils but for the whole coil. Further, since the number of restriction conditions is less, a large number of partial minimum values are problematically provided, and hence it is required to establish restriction conditions that can be suitably added according to division of coils.

In the conventional method for progressing the coil optimization design through the first optimization and the second optimization, structural stability can be achieved by using the allowable stress and the injected current can be reduced to thereby improve temporal stability, but it is more important to acquire magnetic stability related to temporal maintenance in order to more efficiently manage the permanent superconducting magnet.

SUMMARY OF THE INVENTION

It is an advantage of the present invention to provide a method for designing a superconducting magnet for having structural and magnetic stability and for generating high magnetic fields with high uniformity in a predetermined space.

In one aspect of the present invention, a method for designing a superconducting magnet for generating high magnetic fields with high uniformity includes: a) setting volumes of a main coil and a shielding coil as variables, defining the sum of the volumes to be an objective function, and determining initial shapes of the main coil and the shielding coil and division of the main coil by using linear programming based on the objective function; and b) using non-linear programming based on the objective function, and revising the initial shapes of the main coil and the shielding coil determined in a), and determining the shape of a shimming coil.

In the determination on the initial shapes of the main coil and the shielding coil using the linear programming, they are designed by using restriction conditions in which the ratio of the magnetic field in the DSV calculated by the superconducting magnet using system and the central magnetic field calculated by the shape according to the design may be less than $10^{-3}$, and in the case of shimming the main coil and the shielding coil by using non-linear programming, the design is performed by using the restriction condition in which the magnetic uniformity is given to be less than $10^{-5}$. Also, the division of the main coil for acquiring high magnetic fields is performed with the strain and the heat transfer depth as restriction conditions, and when the thickness of the divided main coil fails to satisfy the restriction condition, linear programming is performed again to re-divide the coil.

Determination of an increment for revising the shapes of the main coil and the shielding coil using non-linear programming uses restriction conditions in which the quench strain of the inner superconducting wires other than the restriction condition related to the magnetic uniformity does not exceed the critical quench strain.

DETAILED DESCRIPTION OF THE PREFERRED EMBODIMENTS

Figure 1:
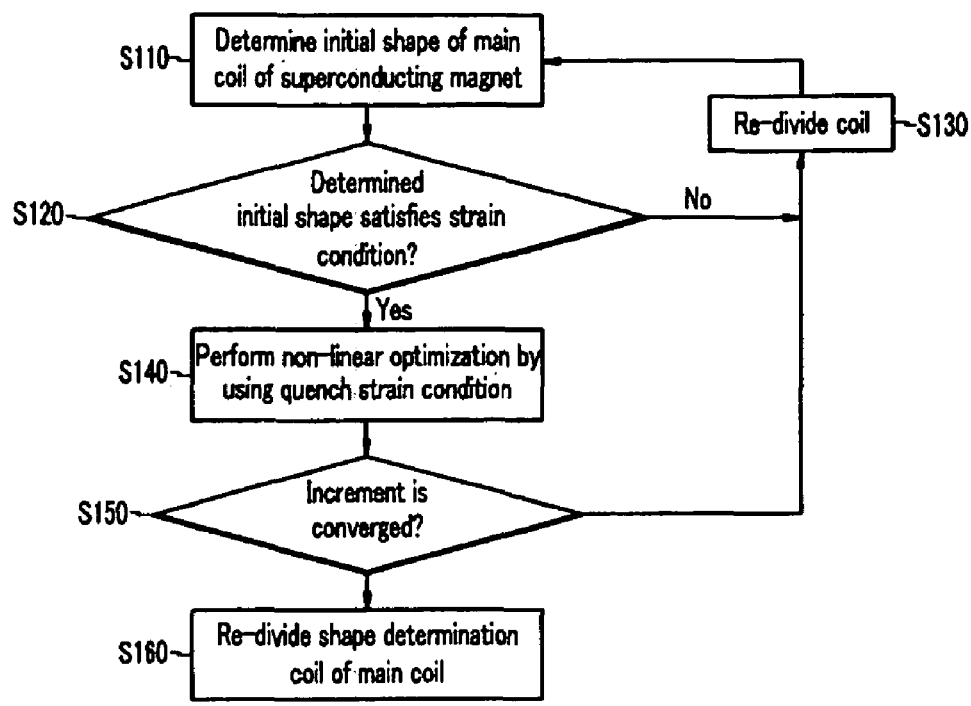
FIG. 1 shows a method for designing a superconducting magnet according to an embodiment of the present invention.

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive. To clarify the present invention, parts which are not described in the specification are omitted, and parts for which same descriptions are provided have the same reference numerals.

Hereinafter, a method for designing a superconducting magnet according to an embodiment of the present invention will be described with reference to drawings.

Figure 2:
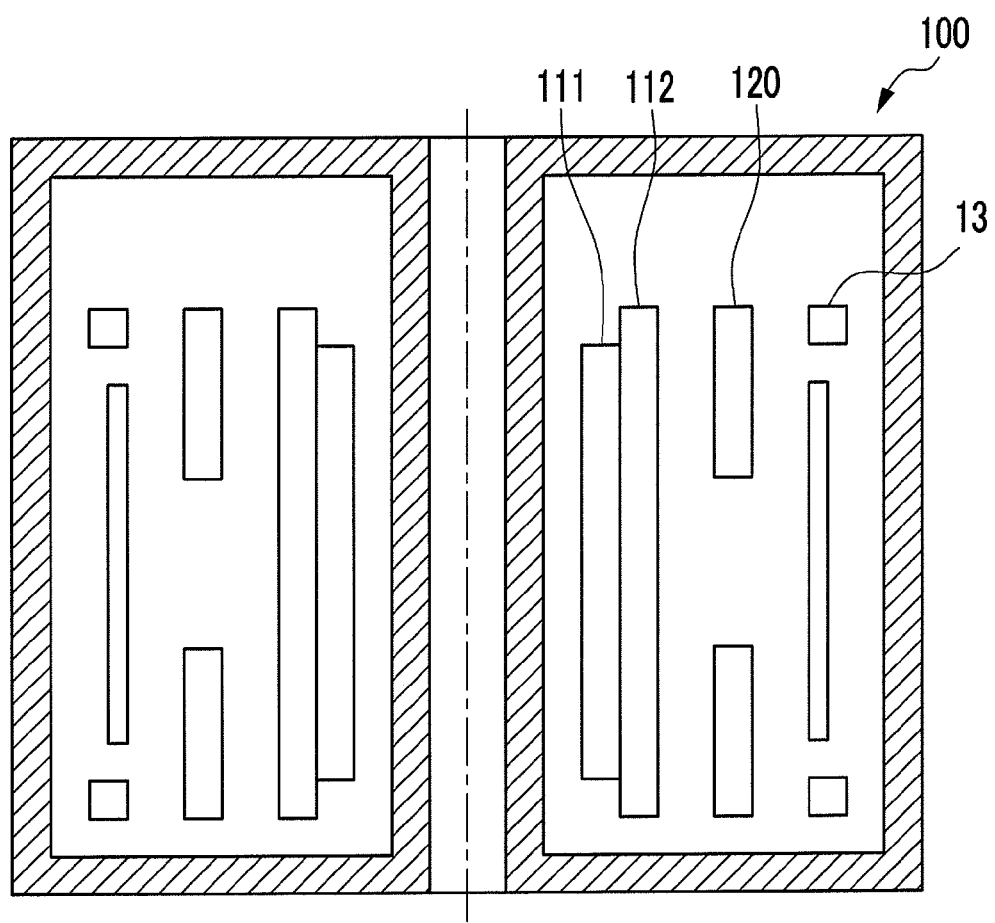
FIG. 2 shows a main coil and a shielding coil of a superconducting magnet according to an embodiment of the present invention.
Figure 3:
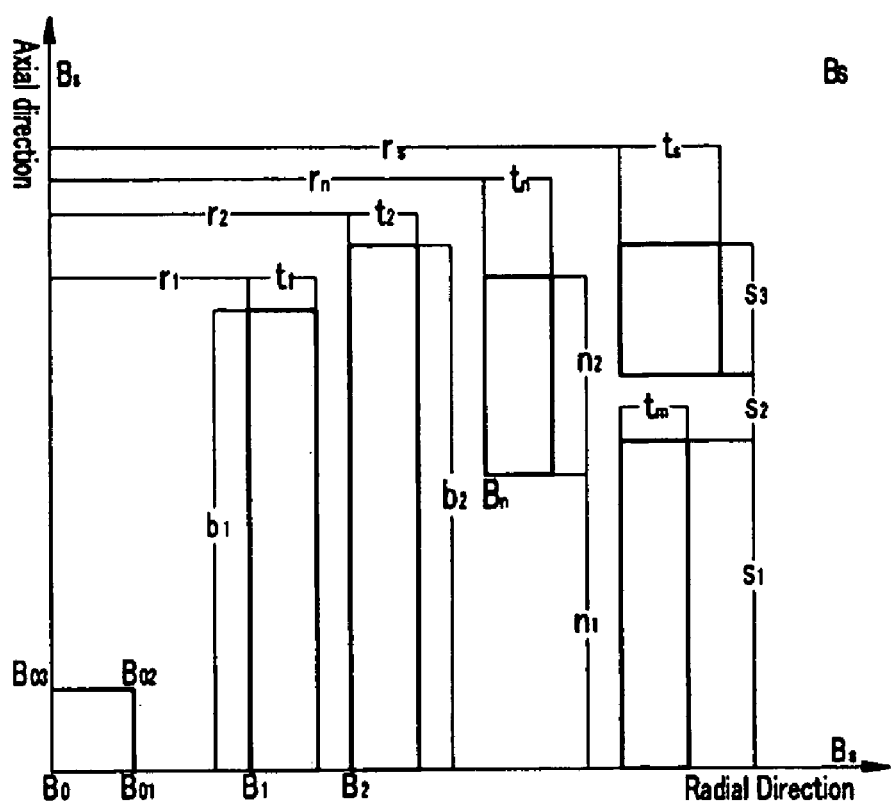
FIG. 3 shows design variables used for generating an optimized shape of a superconducting magnet according to an embodiment of the present invention.

FIG. 1 shows a method for designing a superconducting magnet according to an embodiment of the present invention, and FIG. 2 shows a cross section of a main coil 111, 112 and a shielding coil 13 of a superconducting magnet according to an embodiment of the present invention. FIG. 3 shows design variables used for generating an optimized shape of a superconducting magnet according to an embodiment of the present invention.

The method for designing a superconducting magnet according to an embodiment of the present invention includes a linear optimization step and a non-linear optimization step for finding an optimized shape of the main coil 111, 112. In the first optimization step, shapes of the main coil and the shielding coil 13 are determined by using the linear programming, and it is determined whether to divide the main coil with the strain of the coil as a restriction condition. In the second optimization step, the shape of a shimming coil 120 is determined while revising the shapes of the main coil and the shielding coil by using the non-linear programming, and in this instance, the main coil is re-divided by performing the linear programming when the shape does not approximate to the optimal solution through the revising process. Also, in the second optimization step using the non-linear programming, magnetic stability is acquired by using the strain on the quench stability as a restriction condition.

In the superconducting magnet design, the initial shape of the coil is determined by the spatial restriction given in the system using the superconducting magnet, the division pattern of the main coil 111, 112 is determined and the shielding coil 13 is arranged according to the type of the established wires, and the initial shape of the superconducting magnet is determined so that the total volume of the main coil and the shielding coil may be minimized in step S110. In this instance, the minimization equation for the volume as an objective function for linear optimization is determined by using the variables shown in FIG. 3.

$$V(r_k, t_k, b_k) = \sum_{k=1}^{n} 2\pi w_k [(r_k + t_k)^2 - r_k^2] b_k + \quad \text{Equation 1}$$

$$2\pi w_s s_3 [(r_s + t_s)^2 - r_s^2] + 2\pi w_s s_1 [(r_s + t_m)^2 - r_s^2]$$

As can be known from Equation 1, the objective function used for designing the superconducting magnet can be defined to be a sum of the total volumes of the divided main coils 111, 112 and the volume of the shielding coil 13 where $r_k$ is the inner radius of the main coil (k is the number of divided coils), $t_k$ is the thickness of the main coil, $b_k$ is half the length of the main coil, $r_s$ is the inner radius of the shielding coil, $t_s$ is the thickness of the shielding coil, $s_1$ is the half length of the shielding coil, $s_3$ is the length of the shielding coil, and $w_k$ and $w_s$ are respectively weight coefficients related on wire costs of the divided main coils and the shielding coil that are used.

An optimized design value on the initial shape of the coil is selected so as to satisfy the restriction conditions given in the subsequent Equation 2 by using the linear programming with Equation 1 as an objective function. Since the systems for requiring high magnetic fields such as the FT-ICR MS, the NMR device, and the MRI device have a device that is axially inserted in the system, the length of coil that is usable in the design of the superconducting magnet is limited, and the superconducting wires is used so that the current and the magnetic field are restricted because of the relation of the critical current-magnetic field value of the superconducting wires, which accordingly results in Equation 2.

Equation 2

$$\text{Minimize } [V(r_k, t_k, b_k)] \tag{1}$$

$$|\text{Required Central Magnetic Field} - B_0| \langle 0.001$$

$$\left|\frac{B_0 - B_{0i}}{B_0}\right| \langle \text{Required Magnetic Field Uniformity}[10^3 ppm] \tag{2}$$

$$b_k \langle \frac{\text{Constrained Coil Height}}{2}[m] \tag{3}$$

$$C_k B_k + D_k \langle I[A] \tag{4}$$

As given in Equation 2, the central magnetic field, the magnetic field uniformity, the length of coil, and the injected current are used as restriction conditions so as to perform linear optimization based on the objective function on the volume.

In further detail on the restriction conditions, it is required for the magnetic field generated by the superconducting magnet to satisfy the desired central magnetic field $B_0$ (restriction condition 1). In this instance, though not given in Equation 2, the magnetic field $B_s$ of an external device may function as another restriction condition from among the variables shown in FIG. 3 since a device such as an electric motor for managing a cryostat 100 such as a superconducting magnet is operable below a specific magnetic field.

In addition, in order to control the inserted device efficiently, the magnetic field $B_{0i}$ of the internal device also functions as a restriction condition (restriction condition 2). In this instance, the magnetic field uniformity required by the system can be satisfied only with the main coil by using an infinitely long solenoid in a theoretical method, but it is impossible to realize and design the superconducting magnet using the infinitely long solenoid. Therefore, in the determination on the initial shapes of the main coil 111, 112 and the shielding coil 13 using the above-noted linear programming, it is selected as a restriction condition that the ratio of the central magnetic field required by the superconducting magnet using system and the central magnetic field acquired by the shape generated by the design may be less than the magnetic field uniformity of $10^{-3}$ (restriction condition 3).

The terms of $B_k$, $C_k$, and $D_k$ of the restriction condition 4 are coefficients of the critical current-magnetic field value of the wires, and restriction condition 4 functions as restriction conditions for the injected current.

The variables for indicating the initial shape of the superconducting magnet can be found by using the restriction conditions of Equation 2. In this instance, the thickness of the acquired optimized coil is to sustain the electromagnetic force caused by charging the current in the coil. Support on the electromagnetic force can be defined to be the strain of the coil, and the initial shape of the superconducting magnet is determined by using the strain and the heat transfer depth as other restriction conditions in step S120.

The radial strain $\varepsilon_r$ is found by using Equation 3, and the tangential strain $\varepsilon_t$ is found by using Equation 4.

$$\varepsilon_r = \frac{Jv\left[\begin{array}{c}(3B_r+5B_t)r_k - \\ 8B_r(r_k+t_k)\end{array}\right]\left[\begin{array}{c}(1-v)r_k^2 + (1-v)r_k(r_k+t_k) + \\ 2(2+v)(r_k+t_k)^2\end{array}\right]}{24E[r_k^2 - (r_k+t_k)^2]} \quad \text{Equation 3}$$

$$\varepsilon_t = \frac{J\left[\begin{array}{c}(3B_r+5B_t)r_k - \\ 8B_r(r_k+t_k)\end{array}\right]\left[\begin{array}{c}(1-v)r_k^2 + (1-v)r_k(r_k+t_k) + \\ 2(2+v)(r_k+t_k)^2\end{array}\right]}{24E[r_k^2 - (r_k+t_k)^2]} \quad \text{Equation 4}$$

where E is the modulus of elasticity, v is the Poisson's ratio, $B_r$ is the magnetic field of the inner radius of the main coil, and $B_t$ is the magnetic field of the outer radius of the main coil.

The strain $\varepsilon$ of the coil is a representative including $\varepsilon_t$ and $\varepsilon_r$, the coil strain $\varepsilon$ is to be less than the allowable strain $\varepsilon_a$, which, as a result, functions as a limit value for controlling the coil to be made thinly. In this instance, the allowable strain can be appropriately selected according to the characteristic of the wires used for the superconducting magnet used system and the coil.

$$\varepsilon < \varepsilon_a \quad \text{Equation 5}$$

Also, it is required for the coil to maintain the low temperature so that the coil may function as a superconducting magnet, and when the quench phenomenon occurs in which the hot spot temperature of the superconducting magnet increases to be greater than a specific critical temperature and the wires accordingly loses the superconductivity, it is needed to quickly radiate the heat outwardly and prevent problems which may be caused because of generation of the quench phenomenon. Therefore, the thickness of the coil is to be less than the heat transfer depth $t_q$ of the coil acquired from the heat transfer relation of the coil.

The reference for optimizing the strain for coil division can be defined as follows according to the above-noted two conditions.

$$t_a(\varepsilon_a) < t_k < t_q(T,\varepsilon) \quad \text{Equation 6}$$

where $t_a$ is the upper limit structure allowance value determined by the allowable strain $\varepsilon_a$, and $t_q$ is the lower limit heat transfer depth value determined as a constant according to the temperature and the strain. Since the upper limit structure allowance values are to be respectively found according to variations of the coil shape, it is possible to use Equation 5 which generates the same results as substitutes for them.

When the thickness $t_k$ of the divided coil acquired through the linear programming of the step S110 satisfies the strain optimization references given in Equation 5 and Equation 6, the linear optimization step in the superconducting magnet design is performed.

When the thickness $t_k$ of the divided coil fails to satisfy the strain optimization references, the coil is re-divided and the linear programming is re-performed to find appropriate variables on the initial shapes of the main coil 111, 112 and the shielding coil 13, and the strain optimization references are applied to the found variables in step S130.

In the linear optimization, the position and the shape of the coil are obtained along the central axis and the injected current is determined, and the shimming coil 120 is designated and non-linear optimization is performed in step S140. Objective functions of the second non-linear optimization design and restriction conditions are given in Equation 7.

Equation 7

Minimize $V(r_k, t_k, b_k)$

|Required Central Magnetic Field $- B_o$| $< 0.001$     (5)

$B_s < 0.005[T]$     (6)

$\left|\frac{B_0 - B_{0i}}{B_0}\right| <$ Required Magnetic Field Uniformity [ppm]     (7)

$C_k B_k + D_k < I[A]$     (8)

$t_a(\varepsilon_a) < t_k < t_q(T,\varepsilon)$     (9)

$\varepsilon_q <$ Critical Quench Strain     (10)

where the volume function V uses Equation 1. The values of the inner radius r of the main coil, the thickness t, and the length b obtained through the restriction conditions are finely adjusted by using Equation 8 in step S150. The revising is performed by determining the increments for revising by using the restriction condition that the magnetic field uniformity is controlled to be less than $10^{-6}$ in the case of revising the main coil 111, 112 and the shielding coil 13 using the non-linear programming.

$$r_k^{n+1} = r_k^n + \delta r_k^n$$
$$t_k^{n+1} = t_k^n + \delta t_k^n$$
$$b_k^{n+1} = b_k^n + \delta b_k^n \quad \text{Equation 8}$$

where $\varepsilon_q$ is the quench strain which is found for the inner superconducting wires and is not found for the total coil and represents variation of the diameter of the wires and motion of the coil according to the variation of the coil. The process for revising the initial shape of the main coil acquired in the linear optimization process of S140 and S150 can be repeated until the increment reaches the critical value required by the superconducting magnet using system. When the increment reaches the predefined critical value, the shape of the main coil is determined to be the optimized image in step S160.

The quench strain is selected to be one of restriction conditions in Equation 7 because the diameter of the wires is a main factor related to generation of the quench in the superconducting coil in the charging operation and the current density related to reduction of the quench margin is in inverse proportion to their diameter. Further, magnetic stability can be acquired by defining the movement of the coil as a restriction condition, and the non-linear optimization design uses an increment expression according to the non-linear programming method. In this case, a more accurate shape value of the coil can be generated when the increment is sufficiently reduced to be converged to a predetermined norm.

In this instance, when the increment of Equation 8 is not reduced but is diverged, the coil is re-divided to perform linear programming and the superconducting magnet is designed by using new variables on the initial shape of the main coil acquired through the above-noted process in step S130.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

According to the present invention, superconducting magnets having high uniformity and high magnetic fields can be designed so that the superconducting magnets may have high magnetic field uniformity within predetermined space and may have structural stability and magnetic stability in device operation.

In addition, time and cost used for acquiring the structural stability and magnetic stability can be reduced, and application of the embodiment to the FT-ICR MS, the NMR device, and the MRI device allows high uniformity in the condition of high magnetic fields thereby allowing designing devices with improved analysis performance.

Further, respective positions and shapes of the coils configuring the superconducting magnet are optimally arranged to control stray field to be within an allowable range and acquire structural stability and magnetic stability.

What is claimed is:

1. A method for designing a superconducting magnet for generating high magnetic fields with high uniformity, comprising: a) setting volumes of a main coil and a shielding coil as variables, defining the sum of the volumes to be an objective function, and determining initial shapes of the main coil and the shielding coil and division of the main coil by using linear programming based on the objective function; and b) using non-linear programming based on the objective function, and revising the initial shapes of the main coil and the shielding coil determined in a), and determining the shape of a shimming coil.

2. The method of claim 1, wherein division of the main coil in a) has strain and heat transfer depth as restriction conditions.

3. The method of claim 2, wherein a) is performed again to divide the coil when the thickness of the divided main coil fails to satisfy the reference of strain restriction condition.

4. The method of claim 1, wherein in the process for shimming the initial shapes of the main coil and the shielding coil in b), the quench strain of wires in the coil does not exceed the critical quench strain.

5. The method of claim 4, wherein b) comprises shimming the initial shapes of the main coil and the shielding coil by determining an increment having subsequent equations as restriction conditions, based on the central magnetic field and magnetic field uniformity:

|Required Central Magnetic Field−$B_0$|<0.001

$B_s$<0.005[T]

$$\left|\frac{B_0 - B_{0i}}{B_0}\right| <$$

Required Magnetic Field Uniformity [ppm]

$C_k B_k + D_k < I [A]$ $t_a(\epsilon_a) < t_k < t_q(T, \epsilon)$ $\epsilon_q$<Critical Quench Strain where $B_0$ is the central magnetic field; $B_{0i}$ is the magnetic field of an inner device; $B_k$, $C_k$, and $D_k$ of the restriction condition 4 are coefficients of the current-magnetic field critical value of the wires; I is the current; $B_s$ is the magnetic field of an adjacent device; $t_k$ is the thickness of the solenoid coil; $t_a$ is the lower limit of structural allowance; $t_q$ is the upper limit of heat transfer depth; and $\epsilon_q$ is the critical quench strain.

6. The method of claim 1, wherein b) is repeated until an increment generated by using restriction conditions reaches a predetermined norm.

7. The method of claim 4, wherein a) is repeated to re-divide the coil when the increment is diverged.

8. The method of claim 2, wherein in the process for shimming the initial shapes of the main coil and the shielding coil in b), the quench strain of wires in the coil does not exceed the critical quench strain.

9. The method of claim 3, wherein in the process for shimming the initial shapes of the main coil and the shielding coil in b), the quench strain of wires in the coil does not exceed the critical quench strain.

10. The method of claim 8, wherein b) comprises shimming the initial shapes of the main coil and the shielding coil by determining an increment having subsequent equations as restriction conditions, based on the central magnetic field and magnetic field uniformity:

|Required Central Magnetic Field−$B_0$|<0.001

$B_s$<0.005[T]

$$\left|\frac{B_0 - B_{0i}}{B_0}\right| <$$

Required Magnetic Field Uniformity [ppm]

$C_k B_k + D_k < I [A]$ $t_a(\epsilon_a) < t_k < t_q(T, \epsilon)$ $\epsilon_q$<Critical Quench Strain where $B_0$ is the central magnetic field; $B_{0i}$ is the magnetic field of an inner device; $B_k$, $C_k$, and $D_k$ of the restriction condition 4 are coefficients of the current-magnetic field critical value of the wires; I is the current; $B_s$ is the magnetic field of an adjacent device; $t_k$ is the thickness of the solenoid coil; $t_a$ is the lower limit of structural allowance; $t_q$ is the upper limit of heat transfer depth; and $\epsilon_q$ is the critical quench strain.

11. The method of claim 9, wherein b) comprises shimming the initial shapes of the main coil and the shielding coil by determining an increment having subsequent equations as restriction conditions, based on the central magnetic field and magnetic field uniformity:

|Required Central Magnetic Field−$B_0$|<0.001

$B_s$<0.005[T]

$$\left|\frac{B_0 - B_{0i}}{B_0}\right| <$$

Required Magnetic Field Uniformity [ppm]

$$C_k B_k + D_k < I[A]$$

$$t_a(\epsilon_a) < t_k < t_q(T, \epsilon)$$

$$\epsilon_q < \text{Critical Quench Strain}$$

where $B_0$ is the central magnetic field; $B_{0i}$ is the magnetic field of an inner device; $B_k$, $C_k$, and $D_k$ of the restriction condition 4 are coefficients of the current-magnetic field critical value of the wires; I is the current; $B_s$ is the magnetic field of an adjacent device; $t_k$ is the thickness of the solenoid coil; $t_a$ is the lower limit of structural allowance; $t_q$ is the upper limit of heat transfer depth; and $\epsilon_q$ is the critical quench strain.

12. The method of claim 8, wherein a) is repeated to re-divide the coil when the increment is diverged.

13. The method of claim 9, wherein a) is repeated to re-divide the coil when the increment is diverged.

* * * * *